United States Patent
Inoue (10) Patent No.: US 8,901,969 B2
(45) Date of Patent: Dec. 2, 2014

(54) BI-DIRECTIONAL DRIVER

(75) Inventor: Shingo Inoue, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 358 days.

(21) Appl. No.: 13/330,812

(22) Filed: Dec. 20, 2011

(65) Prior Publication Data

US 2012/0161818 A1 Jun. 28, 2012

(30) Foreign Application Priority Data

Dec. 22, 2010 (JP) .................................. 2010-285514

(51) Int. Cl.
*H03K 3/00* (2006.01)
*H03K 17/16* (2006.01)

(52) U.S. Cl.
CPC ...... *H03K 17/165* (2013.01); *H03K 2217/0045* (2013.01)
USPC .......................................................... 327/108

(58) Field of Classification Search
None
See application file for complete search history.

(56) References Cited

U.S. PATENT DOCUMENTS

| | | | | |
|---|---|---|---|---|
| 5,191,297 A | * | 3/1993 | Penman et al. | 330/146 |
| 5,257,175 A | * | 10/1993 | Skelton et al. | 363/56.02 |
| 6,107,844 A | * | 8/2000 | Berg et al. | 327/110 |
| 6,151,186 A | * | 11/2000 | O'Farrell | 360/78.04 |
| 6,538,395 B2 | * | 3/2003 | Szabados | 315/291 |
| 7,042,256 B2 | * | 5/2006 | Brenden | 327/110 |
| 2008/0157830 A1 | * | 7/2008 | Kume | 327/110 |
| 2011/0006743 A1 | * | 1/2011 | Fabbro | 323/282 |
| 2011/0090775 A1 | * | 4/2011 | Miyagoe et al. | 369/47.38 |

FOREIGN PATENT DOCUMENTS

| | | |
|---|---|---|
| GB | 2 231 176 A | 7/1990 |
| JP | 2002-290172 | 10/2002 |
| JP | 2002-325479 | 11/2002 |
| JP | 2006-40370 | 2/2006 |
| JP | 2006-049370 | 2/2006 |

OTHER PUBLICATIONS

Notification of Reasons for Rejection, Japanese Patent Application No. 2010-285514, dispatch date Jun. 10, 2014.

* cited by examiner

*Primary Examiner* — Lincoln Donovan
*Assistant Examiner* — Khareem E Almo
(74) *Attorney, Agent, or Firm* — Smith, Gambrell & Russell LLP (57) ABSTRACT

An H-bridge driver without implementing with the PWM mode is disclosed. The H-bridge driver of the invention includes a non-inverting amplifier and an inverting amplifier commonly connected to the control signal. When the control signal exceeds the reference, the non-inverting amplifier commonly drives the first pair of transistors diagonally connected to the load. The low side transistor fully turns on but the high side transistor linearly operates. When the control signal is less than the reference, the inverting amplifier commonly drives the second pair of transistors also diagonally connected to the load.

9 Claims, 6 Drawing Sheets

BI-DIRECTIONAL DRIVER

BACKGROUND OF THE INVENTION

1. Field of the Invention

The present application relates to a bi-directional driver, in particular, the application relates to a bi-directional circuit for driving a thermo-electric cooler (hereafter denoted as TEC).

2. Related Prior Arts

The TEC implemented with Peltier elements may choose a function to cool down or heat up a device mounted thereon by the direction of the current flowing. The TEC is often driven by, what is called, an H-bridge circuit (hereafter called merely as an H-bridge).

The H-bridge has an arrangement of a pair of two transistors, where these transistors are connected in series between a power supply and the ground (GND). The TEC is connected between intermediate nodes of the two transistors and driven by the PWM (Pulse Width Modulation) signal. That is, a PWM signal drives two transistors diagonally connected with respect to the TEC to provide a PWM current to the TEC. The direction of the current to the TEC may be changed by switching the transistor pair diagonally connected thereto and the power supplied to the TEC may be adjusted by the period of the PWM signal. A Japanese Patent Application published as JP-2006-040370A has disclosed such an H-bridge driver for the TEC.

SUMMARY OF THE INVENTION

The PWM control generally requires complicated digital circuits and inevitably attributes an inductor with large inductance to convert a pulsed signal into a DC signal for the TEC. The present application provides a bi-directional driver attributed with a primarily analogue operation.

The bi-directional driver to drive a load device comprises an H-bridge driver and an H-bridge. The H-bridge driver includes a non-inverting amplifier and an inverting amplifier. Both amplifiers commonly receive a control signal. The H-bridge includes a first unit and a second unit. The first unit has a high side transistor and a low side transistor. Both transistors are diagonally connected with respect to the load device and commonly receive an output of the non-inverting amplifier. The second unit also includes a high side transistor and a low side transistor. Both transistors of the second unit are diagonally connected with respect to the load device and commonly receive an output of the inverting amplifier.

A feature of an embodiment of the invention is that the low side transistor of the first unit fully turns on and the high side transistor of the first unit linearly operates with respect to the control signal when it is greater than a critical reference, while two transistors in the first unit substantially turn off when the control signal is less than the critical reference. Moreover, the low side transistor of the second unit fully turns on and the high side transistor of the second unit linearly operates with respect to the control signal when it is less than the critical reference, while two transistors in the second unit substantially turn off when the control signal is greater than the critical reference.

BRIEF DESCRIPTION OF THE DRAWINGS

Non-limiting and non-exhaustive embodiments of the present invention will be described with reference to the following figures, wherein like reference numerals refer to like parts throughout the various figures unless otherwise specified.

DESCRIPTION OF EMBODIMENTS

Figure 1:
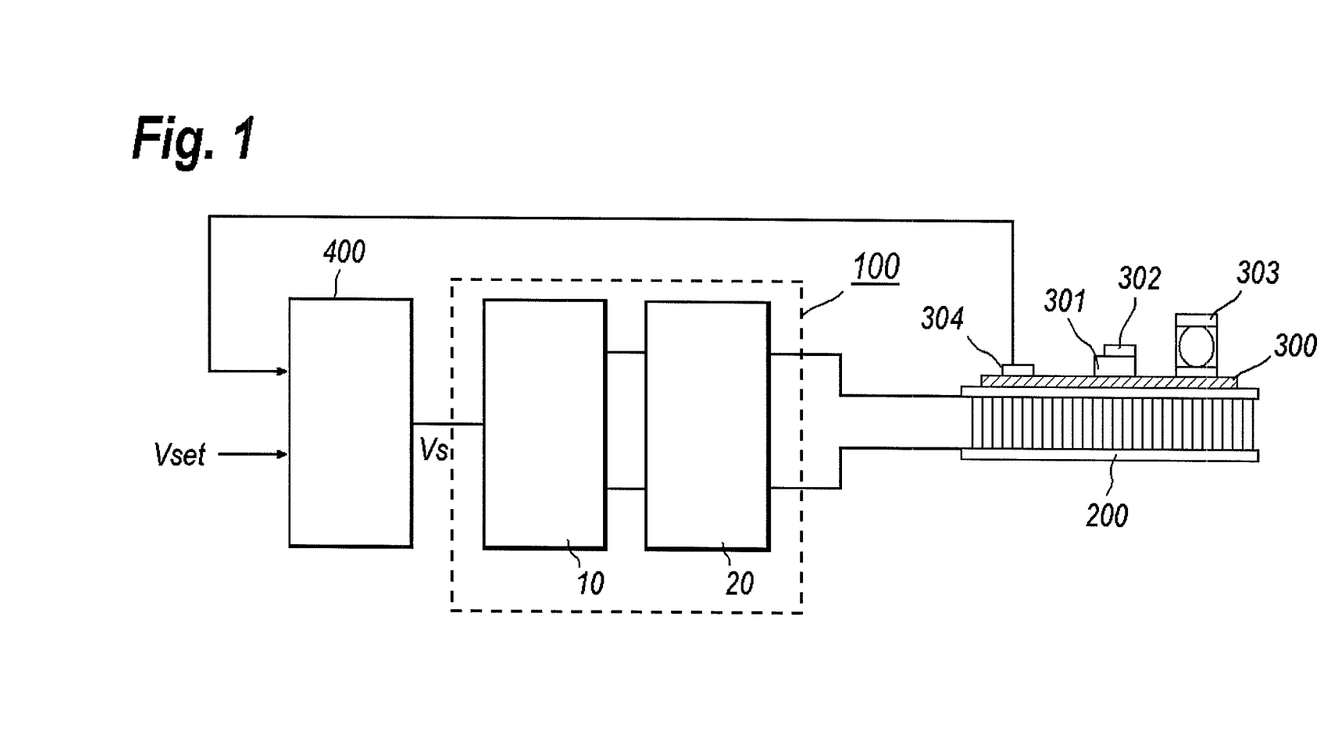
FIG. 1 shows a schematic block diagram of an embodiment according to the present invention.

FIG. 1 is a schematic block diagram of an embodiment of the present invention. The embodiment shown in FIG. 1 is for driving a TEC to control an operating temperature of a semiconductor laser diode. In FIG. 1, a block 100 is a bi-directional driver, a unit 10 is an H-bridge driver, and a unit 20 is an H-bridge. Another block 200 denotes a TEC, which is driven by the bi-directional driver 100 of the embodiment and corresponds to a load of the bi-directional driver 100.

The TEC 200 mounts a carrier 300 thereof. The carrier 300 mounts a semiconductor laser diode (hereafter denoted as LD) 302 by stacking with a chip carrier 301, optical components 303 such as a lens, and a thermistor 304 to sense a temperature of the LD 302 indirectly.

The output of the thermistor 304 is led to a comparator 400, where the comparator 400 may compare the output of the thermistor 304 with a target temperature Tset, and output a control signal Vs that means a difference of the output of the thermistor 304, namely, a current temperature, from the target temperature Tset. The closed loop of the comparator 400, the bi-directional driver 100, and the TEC 200 may operate such that this difference of the current temperature from the target temperature Tset becomes substantially equal to each other.

Figure 2:
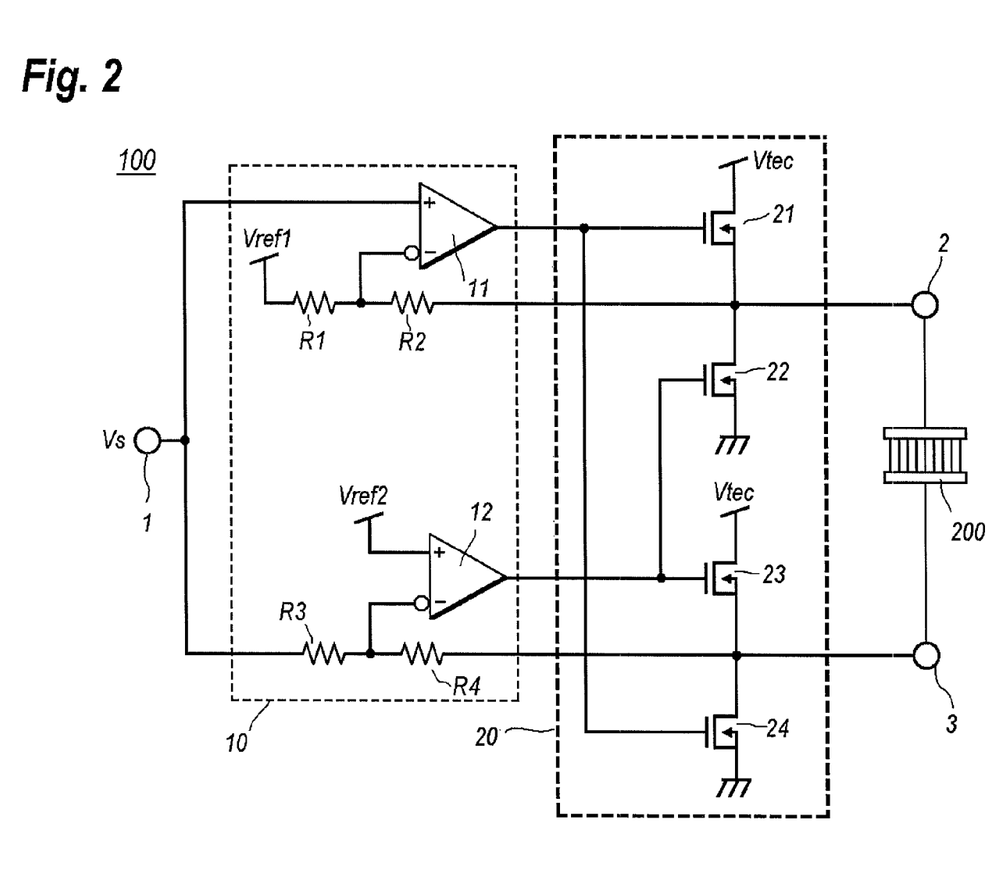
FIG. 2 is a circuit diagram of an H-bridge driver and an H-bridge according to an embodiment of the invention.

FIG. 2 is a circuit diagram of the bi-directional driver 100 of the embodiment. The bi-directional driver 100 may operate, by receiving the control signal Vs in the input terminal 1, to set one of the output terminals 2 in a higher level compared with the other of the output terminals 3, or the output terminal 2 in a lower level compared with the other output terminal 3.

The H-bridge driver 10 may driver the H-bridge 20 based on the control signal Vs, and provides two operational amplifier (hereafter denoted as OpAmp), 11 and 12. The former OpAmp 11 may operate as a non-inverting amplifier. That is, the OpAmp 11 receives the control signal Vs in the non-inverting input thereof, and the inverting input thereof is connected to resistors, $R_1$ and $R_2$. These two resistors, $R_1$ and $R_2$, are connected in series between the first reference $V_{ref1}$ and one of the output terminals 2.

The latter OpAmp 12 may operate as an inverting amplifier. That is, the non-inverting input thereof receives the second reference $V_{ref2}$, while, the inverting input is connected to resistors, $R_3$ and $R_4$. These two resistors, $R_3$ and $R_4$, are connected in series between the input terminal 1 and the other of the output terminals 3.

The H-bridge 20 includes four (4) transistors, 21 to 24. These transistors, 21 to 24, have the same polarity, and the embodiment shown in FIG. 2 has four (4) n-MOSFETs. Two transistors, 21 and 22, which are connected in series between the power supply Vtec and GND, coupled with the output terminal 2. Other two transistors, 23 and 24, which are also connected in series between the power supply Vtec and GND, are coupled with the other output terminal 3.

The operation of the bi-directional driver of the embodiment will be explained. The gain characteristic of the non-inverting amplifier constituted by the OpAmp 11 and two resistors, $R_1$ and $R_2$, is given by:

$$V_2 = (1+R_2/R_1) \times Vs - R_2/R_1 \times V_{ref1},$$

where $V_2$ is the voltage of the output node 2. On the other hand, that of the inverting amplifier comprised of the other OpAmp 12 and two resistors, $R_3$ and $R_4$, is denoted by:

$$V_3 = -R_4/R_3 \times Vs + (1+R_4/R_3) \times V_{ref2},$$

where $V_3$ is the voltage of the output node 3. Accordingly, the difference $\Delta V$ between output nodes, 2 and 3, becomes:

$$\Delta V = V_2 - V_3 = (1+R_2/R_1) \times Vs - R_2/R_1 \times V_{ref1} + R_4/R_3 \times Vs - (1+R_4/R_3) \times V_{ref2}.$$

It is preferable that the non-inverting amplifier and the inverting amplifier have a voltage gain equal to each other against the control signal Vs. That is, assuming a case of:

$$1+R_2/R_1 = R_4/R_3 = G,$$

by adjusting resistance of resistors, $R_1$ to $R_4$, where G denotes the voltage gain; then the voltage difference above, and the voltage of the output terminals become:

$$\Delta V = G \times Vs - (G-1) \times V_{ref1} + G \times Vs - (G+1) \times V_{ref2}$$
$$= 2G \times Vs - (G-1) \times V_{ref1} - (G+1) \times V_{ref2},$$
$$V_2 = G \times Vs - (G-1) \times V_{ref1}, \text{ and}$$
$$V_3 = -G \times Vs + (G+1) \times V_{ref2}.$$

Figure 3:
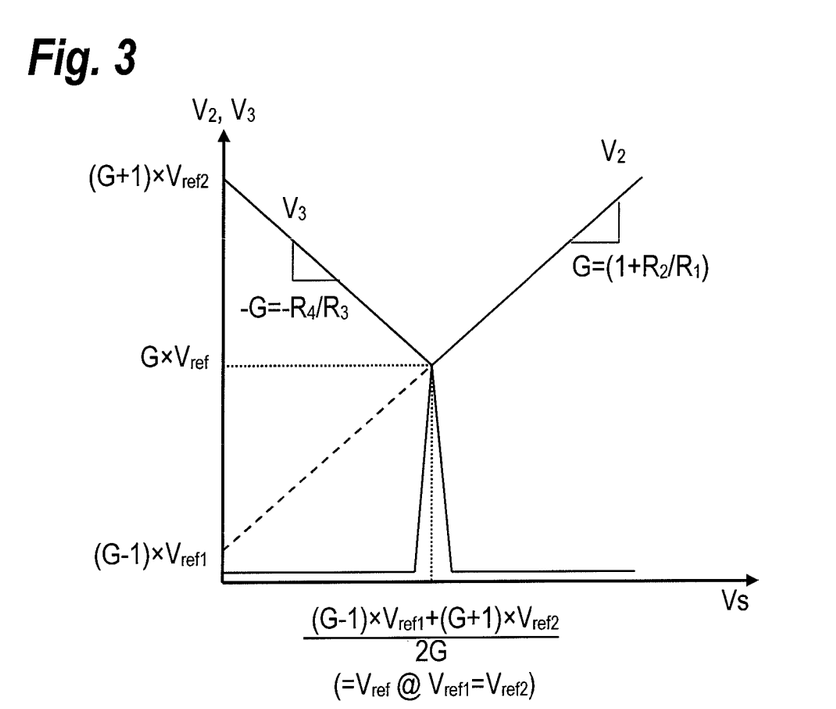
FIG. 3 schematically shows behaviors of two outputs of the bi-directional driver.

FIG. 3 shows respective voltages, $V_2$, $V_3$, and $\Delta V$ when the non-inverting amplifier and the inverting amplifier have the same voltage gain. The voltage difference $\Delta V$ becomes zero when the control signal Vs becomes a critical $V_{SO}$:

$$V_{S0} = \{(G+1) \times V_{ref2} + (G-1) \times V_{ref1}\}/2G.$$

Further assuming a case where two references, $V_{ref1}$ and $V_{ref2}$, are set to be equal to each other, $V_{ref1} = V_{ref2} = V_{ref}$; then the critical control signal $V_{SO}$ above becomes:

$$V_{SO} = V_{ref}$$

Practical voltage level of two output terminals, 2 and 3, are:

$$V_2 = V_3 = G \times V_{ref}.$$

Figure 4:
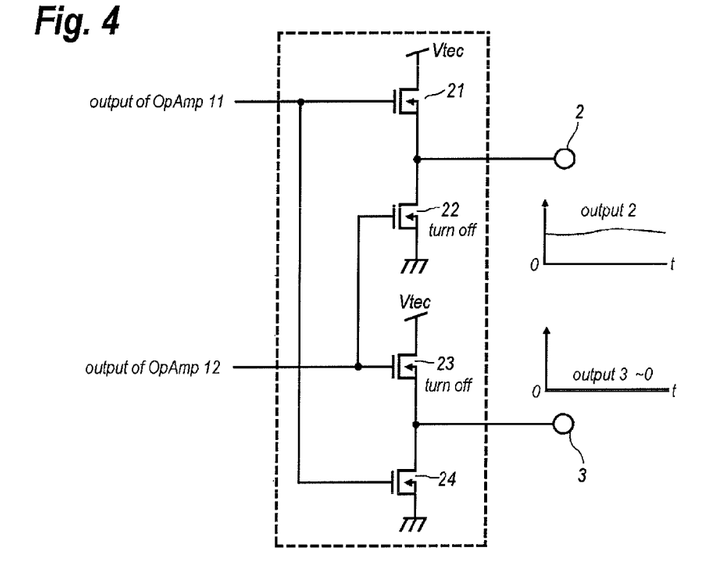
FIG. 4 schematically explains an operation of the bi-directional driver when the control signal is greater than the critical reference.

FIG. 4 shows an operation of the H-bridge 20 when the control signal Vs becomes greater than the critical vale $V_{SO}$ (=$V_{ref}$). Because the first OpAmp 11 may operate as the non-inverting amplifier with respect the reference $V_{ref1}$, the output of the OpAmp 11 swings in positive, while, the other OpAmp 12, which operates as the inverting amplifier, may swing the output thereof in negative. When the OpAmps, 11 and 12, are operated in a single power supply, that is, two OpAmps, 11 and 12, are connected between the positive power supply and GND, the output of the second OpAmp 12 comes close to GND when it receives the control signal Vs greater than the critical value $V_{SO}$. When the OpAmps 11 and 12, are biased between a positive power supply and a negative power supply, the output of the second OpAmp 12 comes close to the negative power supply.

Because the transistor 21 receives the output of the first OpAmp 11 and the other transistor 22 couples with the second OpAmp 12, the transistor 21 is linearly operable while the other transistor 22 turns off. Then, the output of the first OpAmp 11 may appear in the first output terminal 2 through the transistor 21.

Moreover, the transistor 23 receives the output of the second OpAmp 12 and the transistor 24 couples with the first OpAmp 11; accordingly, the former transistor 23 substantially turns off. The other transistor 24, whose source is grounded, and the output of the first OpAmp 11 is designed to exceed the threshold voltage Vth of the transistors when the control signal Vs becomes greater than the critical value $V_{SO}$ (=Vref). Then, the transistor 24 may fully turn on to set the output terminal 3 in the ground. The transistor 24 may operate as an active switch.

Thus, when the control signal Vs exceeds the critical value $V_{SO}$ (=Vref), the transistor 21 may be linearly operable by the output of the first OpAmp 11 and the transistor 24 may fully turn on, which may appear an linear analog signal in the output terminal 2 while substantially ground the other output terminal 3. The current may flow from the output terminal 2 to the other output terminal 3.

Figure 5:
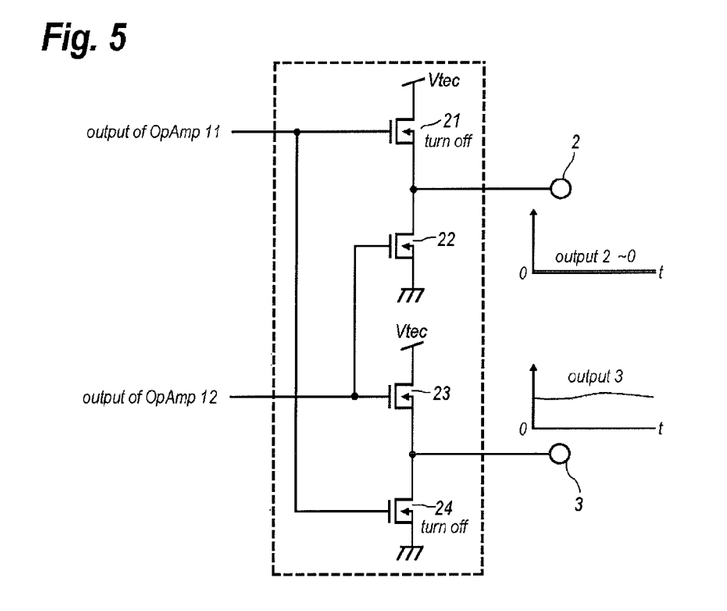
FIG. 5 schematically explains an operation of the bi-directional driver when the control signal is less than the critical reference.

FIG. 5 shows an operation of the H-bridge 20 when the control signal Vs behaves in a range less than the critical value $V_{SO}$ (=$V_{ref}$). Because the first OpAmp 11 operates as the non-inverting amplifier, the output of the first OpAmp 11 comes in close to GND when the OpAmp 11 operates between the positive power supply and GND. When the system including OpAmps, 11 and 12, operates between the positive power supply and the negative power supply, the output of the OpAmp 11 comes in close to the negative power supply. On the other hand, the second OpAmp 12 operates as the inverting amplifier, the output thereof swings in positive. Then, the linear analog signal may output in the terminal 3; while, the other output terminal 2 becomes substantially GND.

The first transistor 21 turns off because it couples with the first OpAmp 11 whose output comes in close to GND or the negative power supply; while, the second transistor 22 receives the output of the second OpAmp 12 that linearly swings. Moreover, the second transistor 22 in the source thereof is grounded, and the output of the second OpAmp 12 may he designed to exceed the threshold voltage Vth of the transistor 22. Thus, the second transistor 22 may fully turn on, or he operable in an active switch.

For the other output terminal 3, the transistor 23 receives the output of the second OpAmp 12, while, the fourth transistor 24 couples with the first OpAmp 11. Because the second OpAmp 12 linearly operates with respect to the control signal Vs, and the first OpAmp 11 in the output thereof comes in close to GND or the negative power supply, which fully turns off the transistor 24, the control signal Vs may linearly appear in the output terminal 3.

Thus, when the control signal Vs is less than the critical value $V_{SO}$ (=$V_{ref}$) the transistor 23 may reflect the input control signal Vs, or may be operable in the linear mode, while, the other transistor 22 may fully turn on to set the output terminal 2 in substantially GND. Thus, the current may flow from the terminal 3 to the other terminal 2, which is completely opposite to a condition where the input control signal Vs is greater than the reference the critical value $V_{SO}$ (=$V_{ref}$).

In the arrangement described above, even when one of the outputs from the OpAmps, 11 or 12, is commonly provided to respective transistors, 21 and 24, or 22 and 23, each diagonally connected with respect to the load device, namely, the TEC 200 between two output terminals, 2 and 3, the low side transistors, 22 and 24, may fully turn on because the source thereof is grounded. On the other hand, the high side transistors, 21 or 23, may linearly operate even when they receive the output commonly provided to the low side transistors, 22 or 24, because the source thereof is grounded through the load device, namely, the TEC 200 and the low side transistor, 22 or 24. Thus, the H-bridge driver 10 and the H-bridge 20 may be operable in the analogue mode.

The embodiment thus described provides transistors, 21 to 24, of the n-MOSFET. However, the H-bridge 20 may be constituted by p-MOSFETs by setting the power supply Vtec in negative, for instance −1.1V, and the OpAmps, 11 and 12, are operated between a negative power supply and GND.

Figure 6:
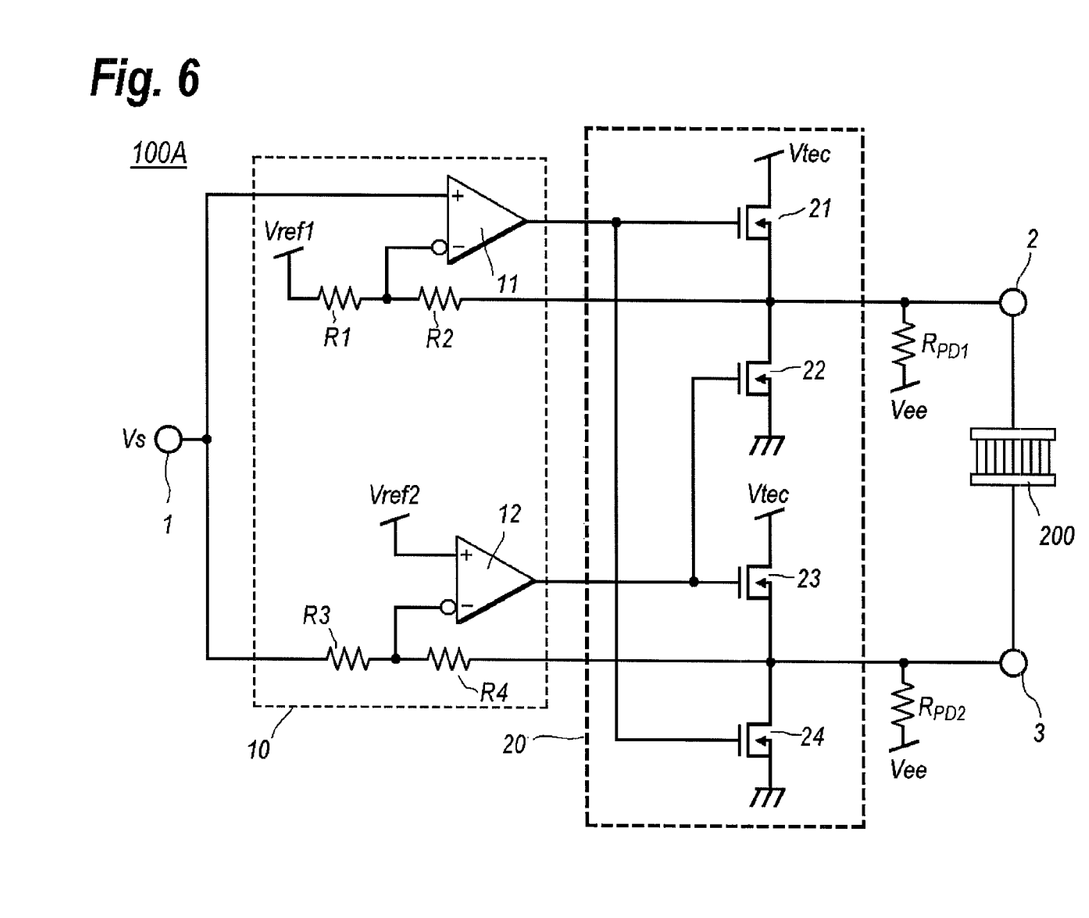
FIG. 6 is a circuit diagram of the bi-directional driver according to another embodiment of the invention.

Next, another embodiment according to the present invention will be described. FIG. 6 is a circuit diagram of the bi-directional driver 100A according to the second embodiment of the invention. In FIG. 6, elements having the same arrangement with those of the first embodiment 100 shown in FIG. 2 are referred by the numerals same with those of the first embodiment.

The bi-directional driver 100A shown in FIG. 6 further provides two resistors, $RPD_1$ and $RPD_2$, each connected between the output terminals, 2 and 3, and the negative power supply Vee. In the first embodiment, when the control signal Vs comes close to the reference Vref, which means that two output terminals in the voltage level thereof becomes equal to each other, the current flowing from one of output terminals to the other becomes substantially zero, which makes the OpAmps, 11 and 12, instable. That is, no current flows in resistors, $R_1$ and $R_2$, also in resistors, $R_3$ and $R_4$; accordingly, the output of respective OpAmps, 11 and 12, is unable to be decided.

The second embodiment shown in FIG. 6 provides resistors, $RPD_1$ and $RPD_2$, in respective output terminals, 2 and 3, to pull the level of the output terminals, 2 and 3, down to the negative power supply Vee. Even when two output terminals, 2 and 3, becomes even and no current flow in the load, a dummy current flows from the first reference $V_{ref1}$ to the negative power supply Vee through resistors, $R_1$, $R_2$ and $RPD_1$; or from the input terminal 1 to the negative power supply Vee from resistors, $R_3$, $R_4$, and $RPD_2$, which may make the operating of OpAmps, 11 and 12, stable. The level of the negative power supply Vee is optional, or unnecessary to be a constant voltage source.

Still another embodiment will be described. The bi-directional driver of the first embodiment 100 and that of the second embodiment 100A possibly have an instant where all transistors, 21 to 24, linearly operate or a large current flows from the power supply Vtec to GND when the control signal Vs crosses the reference Vref. Offsetting the output of the OpAmp, 11 or 12, in negative to prevent the instant when two transistors, 21 and 22, or another two transistors, 23 and 24, flow a large current.

Figure 7A:
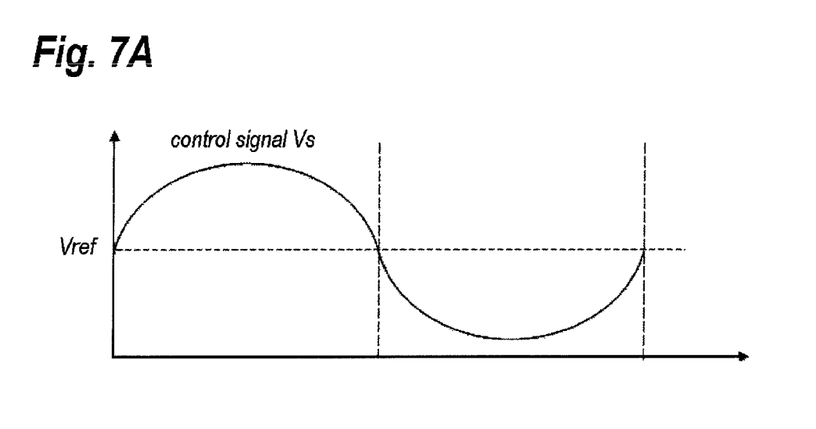
FIGS. 7A to 7C explain a function of an offset induced in the output of respective OpAmps.
Figure 7B:
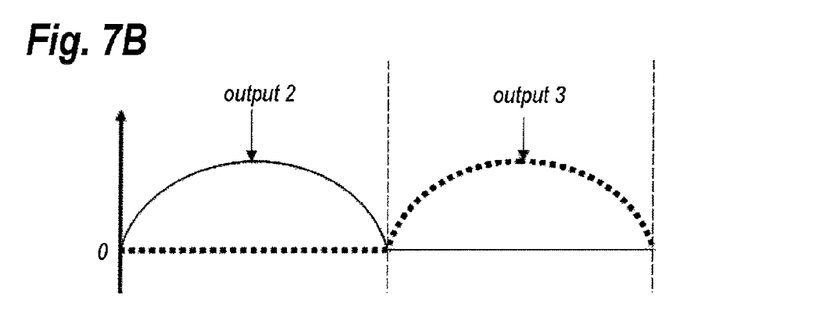
Figure 7C:
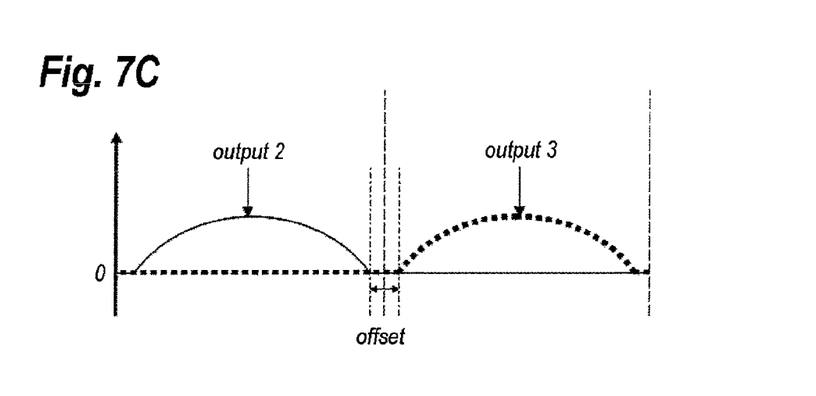

FIGS. 7A to 7C schematically explain the mechanism to offset the output of the OpAmps, 11 and 12, in negative. Assuming a case where the control signal Vs varies as shown in FIG. 7A, the output of the OpAmps, 11 and 12, becomes those shown in FIG. 7B without any offset in the output thereof; while, FIG. 7C shows the output thereof with a negative offset, where the OpAmps, 11 and 12, are operated between the positive power supply and GND. When no offset is applied to the output of the OpAmps, 11 and 12, the output of the first OpAmp 11 behaves as the solid line, while, that of the second OpAmp 12 is denoted by the dotted line. In an ideal condition, the operation of two transistor pairs, 21 and 24, driven by the first OpAmp 11, and those, 22 and 23, driven by the second OpAmp 12 momentarily exchange when the control signal Vs crosses the critical value $V_{SO}$ (=$V_{ref}$). However, the practical device inherently has a scattering in the performance thereof, which may overlap the operation of two transistor pairs and a large current possibly flows from the high side transistor, 21 or 23, to the low side transistor, 22 or 24, which may break the transistors.

Applying the offset in the output of the OpAmps, 11 and 12, as shown in FIG. 7C, transistor pairs, 21 and 24, and another pair, 22 and 23, may be escaped from a simultaneous operation. The offset may be adjusted by two references, $V_{ref1}$ and $V_{ref2}$/and four (4) resistors, $R_1$ to $R_4$.

The present invention is not restricted to those embodiment described above. The bi-directional driver according to the present invention may be applicable not only to driver the TEC but to driver other power equipments, for instance, an electrical motor. Moreover, circuit arrangements of the bi-directional driver may be varied within a wide scope of the invention.

I claim:

1. A bi-directional driver to drive a load device, comprising:
   an H-bridge driver including a non-inverting amplifier having an operational amplifier and an inverting amplifier having an operational amplifier, the non-inverting amplifier and the inverting amplifier commonly receiving a control signal; and
   an H-bridge including,
   a first unit having a high side transistor and a low side transistor, the high side transistor and the low side transistor of the first unit being diagonally connected with respect to the load device and commonly receiving an output of the non-inverting amplifier, and
   a second unit having a high side transistor and a low side transistor, the high side transistor and the low side transistor of the second unit being diagonally connected with respect to the load device and commonly receiving an output of the inverting amplifier,
   wherein an inverting input of the operational amplifier of the non-inverting amplifier is coupled with an output of the first unit, and an inverting input of the operational amplifier of the inverting amplifier is coupled with an output of the second unit,
   wherein the load device is connected between the output of the first unit and the output of the second unit,
   wherein the low side transistor of the first unit fully turns on and the high side transistor of the first unit linearly operates in response to the control signal being greater than a critical value, and
   wherein the low side transistor of the second unit fully turns on and the high side transistor of the second unit linearly operates in response to the control signal being less than the critical value.

2. The bi-directional driver of claim 1, wherein the low side transistor of the first unit and the low side transistor of the second unit are each grounded at a current electrode thereof.

3. The bi-directional driver of clam 2, wherein the low side transistor of the first unit and the low side transistor of the second unit each are an n-MOSFET and are grounded at the source thereof.

4. The bi-directional driver of claim 1,
   wherein the high side transistor of the second unit and the low side transistor of the second unit turn off when the control signal is greater than the critical value, and
   wherein the high side transistor of the first unit and the low side transistor of the first unit turn off when the control signal is less than the critical value.

5. The bi-directional driver of claim 1,
   wherein the output of the first unit and the output of the second unit are pulled down to a negative potential.

6. The bi-directional driver of claim 1,
wherein the inverting input of the operational amplifier of the non-inverting amplifier also is coupled with a first reference, and the inverting input of the operational amplifier of the inverting amplifier also is coupled with a second reference.

7. The bi-directional driver of claim 6, wherein the first reference is equal to the second reference.

8. The bi-directional driver of claim 1,
wherein the non-inverting amplifier has a gain with an absolute value equal to a gain of the non-inverting amplifier.

9. The bi-directional driver of claim 1,
wherein the first unit and the second unit are inactive when the control signal is in a vicinity of the critical value.

\* \* \* \* \*